(12) United States Patent
Kita et al.

(10) Patent No.: US 7,994,634 B2
(45) Date of Patent: Aug. 9, 2011

(54) SEMICONDUCTOR ELEMENT AND SEMICONDUCTOR ELEMENT FABRICATION METHOD

(75) Inventors: Takeshi Kita, Hyogo (JP); Kazushi Higashi, Osaka (JP)

(73) Assignee: Panasonic Corporation, Osaka (JP)

( * ) Notice: Subject to any disclaimer, the term of this patent is extended or adjusted under 35 U.S.C. 154(b) by 56 days.

(21) Appl. No.: 12/408,829

(22) Filed: Mar. 23, 2009

(65) Prior Publication Data

US 2009/0243120 A1    Oct. 1, 2009

(30) Foreign Application Priority Data

Mar. 25, 2008    (JP) .................................. 2008-077665
Mar. 4, 2009     (JP) .................................. 2009-051187

(51) Int. Cl.
*H01L 23/48* (2006.01)
(52) U.S. Cl. ................. 257/698; 257/774; 257/E23.001; 257/E21.597; 438/667
(58) Field of Classification Search ............ 257/E21.594
See application file for complete search history.

(56) References Cited

U.S. PATENT DOCUMENTS

| 5,501,893 A | 3/1996 | Laermer et al. |
| 2004/0061238 A1* | 4/2004 | Sekine .......................... 257/774 |

| 2006/0170112 A1 | 8/2006 | Tanaka et al. |
| 2009/0051012 A1 | 2/2009 | Maebashi |
| 2009/0061659 A1 | 3/2009 | Maebashi |

FOREIGN PATENT DOCUMENTS

| CN | 1490875 A | 4/2004 |
| JP | 7-503815 | 4/1995 |
| JP | 2002-043502 A | 2/2002 |
| JP | 2007-067216 A | 3/2007 |
| JP | 2009-055004 A | 3/2009 |

OTHER PUBLICATIONS

Japanese Office Action for Application No. JP 2009-051187, Feb. 23, 2010, Panasonic Corporation.
Japanese Office Action for Application No. JP 2009-051187, Aug. 24, 2010, Panasonic Corporation.
Chinese Office Action for Application No. 200910132440.1, Sep. 13, 2010, Panasonic Corporation.

* cited by examiner

*Primary Examiner* — Ha Tran T Nguyen
*Assistant Examiner* — Shaka Scarlett
(74) *Attorney, Agent, or Firm* — RatnerPrestia

(57) ABSTRACT

A semiconductor element is provided that includes a semiconductor substrate, a circuit element disposed on the substrate, and a through-hole formed in the substrate having a stripe-like concavo-convex structure on its sidewall with stripes formed in the direction of the thickness of the semiconductor substrate.

14 Claims, 15 Drawing Sheets

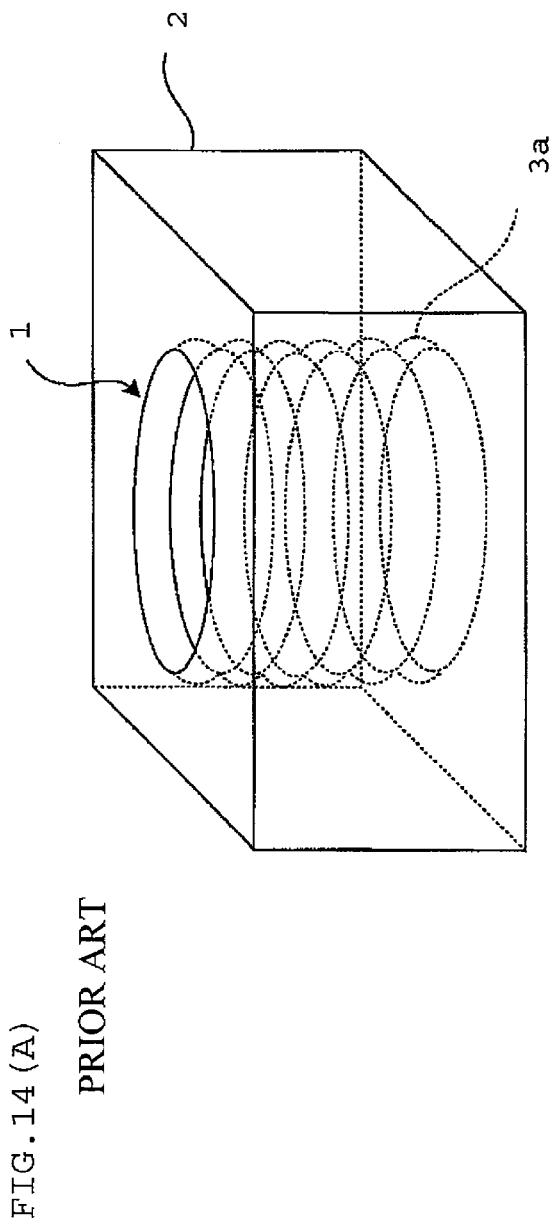
FIG. 14 (A) PRIOR ART
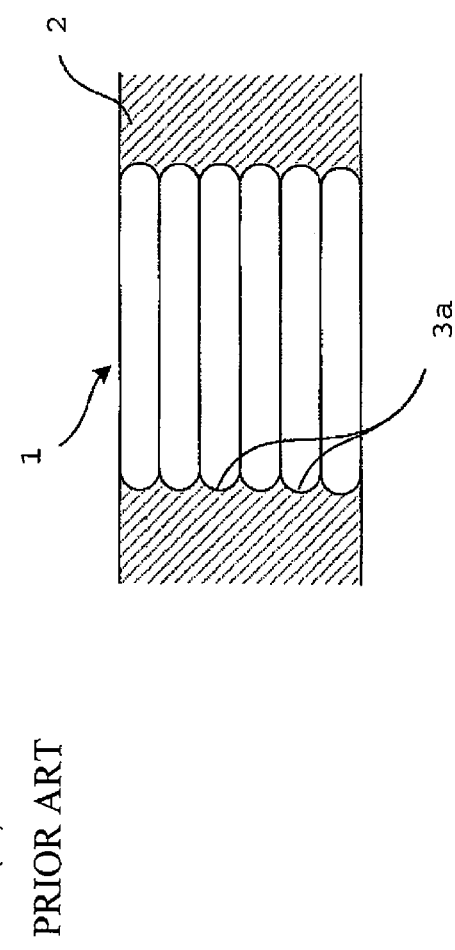
FIG. 14 (B) PRIOR ART

SEMICONDUCTOR ELEMENT AND SEMICONDUCTOR ELEMENT FABRICATION METHOD

BACKGROUND OF THE INVENTION

1. Field of the Invention

The present invention relates to a semiconductor element, for example a semiconductor element having a through-electrode formed in a through-hole in a semiconductor substrate, and a semiconductor element fabrication method.

2. Related Art of the Invention

First, a conventional semiconductor element and a method to fabricate the semiconductor element will be described with reference to FIG. 13.

FIG. 13 is a schematic cross-sectional view of through-electrodes and a neighboring portion of a conventional semiconductor element taken along a plane including the thickness of a semiconductor substrate 2.

A through-hole 1 is first formed by a dry etching method or the like in the material of the semiconductor substrate 2 on which an etching mask is formed.

Then, an insulating film (not shown) is deposited on the sidewall of the through-hole 1 by a method such as CVD (Chemical Vapor Deposition) and a seed layer (not shown) is formed on the insulating film. The through-hole 1 is then filled with a conductive material by a method such as plating to form a through-electrode that penetrates the semiconductor substrate 2.

A first wiring layer 4 is formed at one end of the through-electrode and the first wiring layer 4 is electrically connected to a circuit element 6 mounted on or formed on the semiconductor substrate 2.

A second wiring layer 5 is formed at the other end of the through-electrode and the second wiring layer 5 is electrically connected to an external circuit 7 through a terminal such as a solder ball 8.

One typical deep etching method using a dry etching method of the material of a silicon semiconductor substrate 2 used for forming through-holes 1 is the Bosch process (see for example Japanese Unexamined Patent Application Publication (Translation of PCT Application) No. 07-503815).

The Bosch process repeatedly alternates between an etching step in which an etching gas, which is $SF_6$ (sulfur hexafluoride) gas or a mixture gas of $SF_6$ containing Ar (argon) gas up to several tens of percent, is used to etch the material of a semiconductor substrate 2 to form a hole and a deposition step in which $C_4F_8$ (octafluorocyclobutane) gas is used to deposit a fluorocarbon polymer on the sidewall of the hole as a passivation film, thereby achieving anisotropic etching of silicon.

The Bosch process can achieve etching rates of, for example, 20 μm/min or more and can form a through-hole 1 in the direction of the thickness of the semiconductor substrate 2 that has the shape of a trench whose sidewall is perpendicular to the surface of the semiconductor substrate 2.

The Bosch process will be described below in further detail.

In the etching step described above, the etching gas is dissociated to generate plasma by applying an electromagnetic wave in a chamber used in the dry etching method. F (fluorine) ions and F radicals in the plasma are bombarded on regions of the material of the semiconductor substrate 2 where an etching mask is not formed. A substrate bias is applied to the semiconductor substrate 2 in order to accelerate charged F ions in the direction of the thickness of the semiconductor substrate 2.

The bombardment described above sputters Si (silicon) in the semiconductor substrate 2 to continue chemical reaction of Si with F ions and F radicals to etch the material of the semiconductor substrate 2.

However, F radicals which carry no charge diffuse not only in the direction of the thickness of the semiconductor substrate 2 but in all directions and, as a result, etching of the sidewall of the through-hole 1, as well as etching in the direction of the thickness of the semiconductor substrate 2, is carried out.

Therefore, after the hole is etched to some depth in the etching step, a passivation film is formed on the sidewall of the hole in the deposition step described above, thereby suppressing etching of the sidewall of the hole in the next etching step.

The etching step and deposition step are repeated in this way to further etch the semiconductor substrate 2 in the thickness direction while suppressing etching of the sidewall of the through-hole 1. As a result, desired anisotropic etching can be achieved.

However, since the conventional semiconductor element fabrication method described above repeatedly alternates and proceeds between the etching step and the deposition step to etch in the direction of the thickness of the semiconductor substrate 2, periodic recesses are formed in the sidewall of the through-hole 1 with respect to the direction of the thickness of the semiconductor substrate 2.

In particular, a bellows-like concavo-convex structure 3a as shown in FIGS. 14(A) and 14(B), called scallop, is formed on the sidewall of the through-hole 1. The stripes of the concavo-convex structure 3a are laterally formed as shown.

FIG. 14(A) is a schematic perspective view of the through-hole 1 of the conventional semiconductor element and FIG. 14(B) is a schematic cross-sectional view of the through-hole 1 of the conventional semiconductor element taken along a plane including the thickness of the semiconductor substrate 2.

As a result, the uniformity of the thickness and the degree of adhesion to the surface of the sidewall of the insulating film, which is deposited on the sidewall with vapor supplied from above the through-hole 1, to the sidewall by CVD method are degraded because of the concavo-convex structure 3a having the lateral stripes. Accordingly, the uniformity of the thickness of the seed layer formed on the insulating film is also degraded. Consequently, a phenomenon may occur that the reliability of a through-electrode formed by filing the through-hole 1 with a conductive material by plating decreases.

If the seed layer is formed by sputtering, since the seed layer tends to be discontinuous in recesses, the plating thickness cannot be made uniform in the subsequent step of filling the through-hole 1 with a conductive material by plating. At the worst, a phenomenon may occur that voids (bubbles) are generated and the reliability of the through-electrode significantly degrades.

The inventor has found that such phenomena can occur in the conventional semiconductor fabrication method.

The present invention has been made in view of the problem with the conventional technique described above and an object of the present invention is to provide a semiconductor element and a semiconductor element fabrication method, capable of improving the reliability of through-electrodes formed in through-holes of a semiconductor substrate.

SUMMARY OF THE INVENTION

The $1^{st}$ aspect of the present invention is a semiconductor element comprising:

a semiconductor substrate;

a circuit element disposed on the semiconductor substrate; and a through-hole formed in the semiconductor substrate and having a stripe-like concavo-convex structure on its sidewall;

wherein stripes of the stripe-like concavo-convex structure are formed in a direction of a thickness of the semiconductor substrate.

The $2^{nd}$ aspect of the present invention is the semiconductor element according to the $1^{st}$ aspect of the present invention, wherein a conductive material electrically connected to an electrode of the circuit element is formed inside the through-hole.

The $3^{rd}$ aspect of the present invention is the semiconductor element according to the $1^{st}$ aspect of the present invention, wherein an aperture of the through-hole at an upper surface of the semiconductor substrate is greater in diameter than an aperture of the through-hole at a lower surface of the semiconductor substrate.

The $4^{th}$ aspect of the present invention is the semiconductor element according to the $1^{st}$ aspect of the present invention, wherein the semiconductor substrate is made of a silicon system semiconductor or a compound semiconductor.

The $5^{th}$ aspect of the present invention is the semiconductor element according to the $4^{th}$ aspect of the present invention, wherein the silicon system semiconductor is silicon or silica-germanium, and the compound semiconductor is gallium arsenide, gallium nitride or indium phosphorus.

The $6^{th}$ aspect of the present invention is the semiconductor element according to the $1^{st}$ aspect of the present invention, wherein the through-hole is formed by using a dry etching method.

The $7^{th}$ aspect of the present invention is the semiconductor element according to the $6^{th}$ aspect of the present invention, wherein the stripe-like concavo-convex structure is formed by using (1) indentations of an edge of an etching window of an etching mask used in the dry etching method or (2) impurities contained in a material of the semiconductor substrate.

The $8^{th}$ aspect of the present invention is the semiconductor element according to the $6^{th}$ aspect of the present invention, wherein the dry etching method comprises the steps of:

forming an etching mask on a material of the semiconductor substrate; and etching the material of the semiconductor substrate on which the etching mask is formed, by using an etching gas in which oxygen is mixed.

The $9^{th}$ aspect of the present invention is a semiconductor element fabrication method comprising the steps of:

forming, while forming a through-hole in a material of a semiconductor substrate, a stripe-like concavo-convex structure on a sidewall of the through-hole, stripes of the stripe-like concavo-convex structure being formed in a direction of a thickness of the material of the semiconductor substrate;

forming a conductive material inside the through-hole; and electrically connecting the conductive material to an electrode of a circuit element.

The $10^{th}$ aspect of the present invention is the semiconductor element fabrication method according to the $9^{th}$ aspect of the present invention, wherein the through-hole is formed by using a dry etching method.

The $11^{th}$ aspect of the present invention is the semiconductor element fabrication method according to the $10^{th}$ aspect of the present invention, wherein the stripe-like concavo-convex structure is formed by using (1) indentations of an edge of an etching window of an etching mask used in the dry etching method or (2) impurities contained in the material of the semiconductor substrate.

The $12^{th}$ aspect of the present invention is the semiconductor element fabrication method according to the $10^{th}$ aspect of the present invention, wherein the dry etching method comprises the steps of:

forming an etching mask on the material of the semiconductor substrate; and etching the material of the semiconductor substrate on which the etching mask is formed, by using an etching gas in which oxygen is mixed.

The $13^{th}$ aspect of the present invention is the semiconductor element fabrication method according to the $10^{th}$ aspect of the present invention, wherein relationships between a size and/or a shape of the stripe-like concavo-convex structure, and (1) a degree of vacuum in a chamber used in the dry etching method, (2) a kind and/or an amount of a gas mixed in an etching gas in order to adjust a partial pressure of the etching gas in the chamber, (3) a level of a substrate bias applied to the material of the semiconductor substrate, (4) a size and/or a shape of an etching window of an etching mask used in the dry etching method, and (5) impurities contained in the material of the semiconductor substrate, are examined beforehand; and the degree of vacuum in the chamber, the kind and/or the amount of the gas to be mixed, the level of the substrate bias to be applied, and the size and/or the shape of the etching window, are set on a basis of results of an examination to form the through-hole.

The $14^{th}$ aspect of the present invention is the semiconductor element fabrication method according to the $10^{th}$ aspect of the present invention, wherein a gas for depositing a reaction product on the sidewall of the through-hole is added to an etching gas.

The configurations of the present invention can provide a semiconductor element and a semiconductor element fabrication method, capable of improving the reliability of through-electrodes formed in through-holes of a semiconductor substrate.

BRIEF DESCRIPTION OF THE DRAWINGS

FIG. 14(A) is a schematic perspective view of a through-hole of the conventional semiconductor element; and FIG. 14(B) is a schematic cross-sectional view of the through-hole of the conventional semiconductor element taken along a plane including the thickness of the semiconductor substrate.

Description of Symbols

| | |
|---|---|
| 1 | Through-hole |
| 2, 12 | Semiconductor substrate |
| 3, 3a | Concavo-convex structure |
| 4 | First wiring layer |
| 5 | Second wiring layer |
| 6 | Circuit element |
| 7 | External circuit |
| 8 | Solder ball |
| 9 | First insulating layer |
| 10 | Second insulating layer |
| 11 | Conductive material |
| 19 | Seed layer |
| 111 | Through-electrode |
| 110 | Third insulating layer |

-continued

Description of Symbols

| | |
|---|---|
| 201 | Chamber |
| 202 | Substrate electrode |
| 203 | Etching mask |
| 204 | Surfatron |
| 205 | High-frequency generator |
| 301, 302, 303 | Impurity |

PREFERRED EMBODIMENTS OF THE INVENTION

Embodiments of the present invention will be described in detail below with reference to the accompanying drawings.

First Embodiment

Mainly referring to FIGS. 1(A) and 1(B) and FIGS. 2(A) and 2(B), a semiconductor element and a semiconductor element fabrication method according to the first embodiment will be described.

Figure 1A:
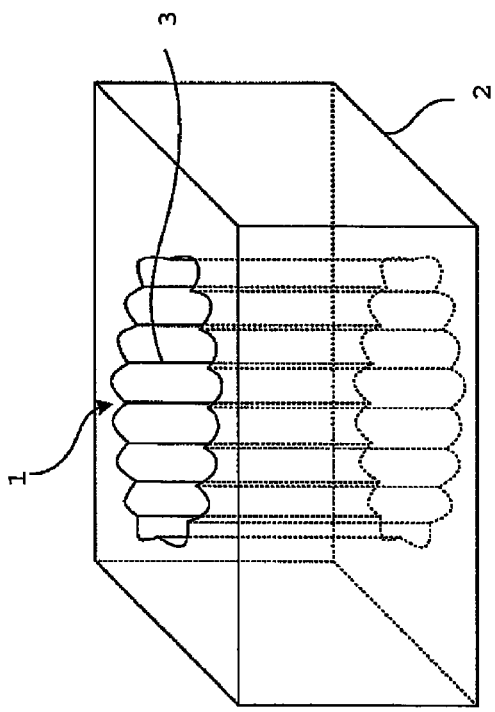
FIG. 1(A) is a schematic perspective view of a through-hole of a semiconductor element according to the first embodiment of the present invention.
Figure 1B:
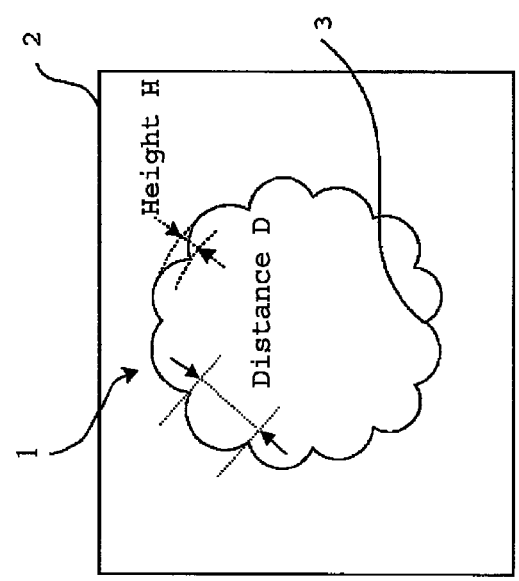
FIG. 1(B) is a schematic plan view of the through-hole of the semiconductor element according to the first embodiment of the present invention.

FIG. 1(A) is a schematic perspective view of a through-hole 1 of a semiconductor element according to the first embodiment of the present invention and FIG. 1(B) is a schematic plan view of the through-hole 1 of the semiconductor element according to the first embodiment of the present invention.

Figure 2A:
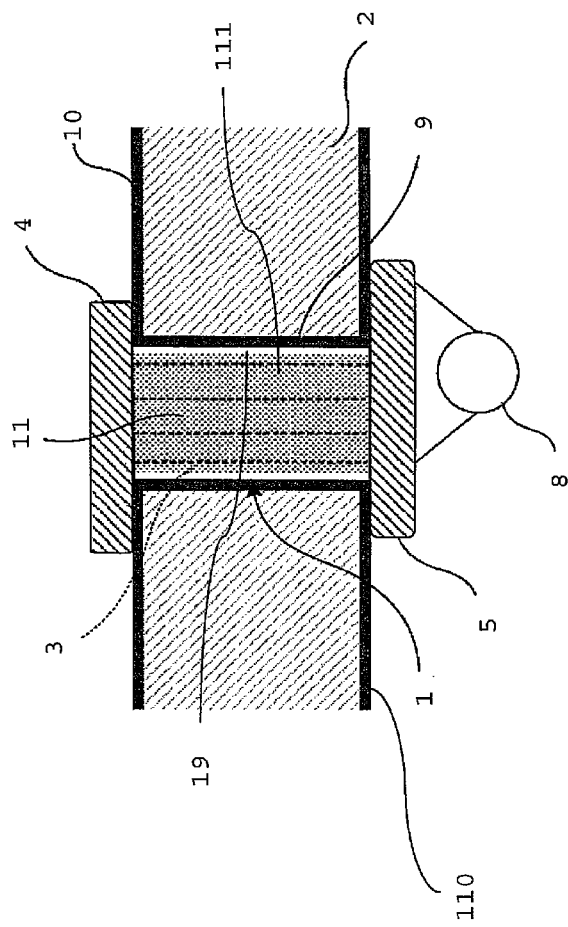
FIG. 2(A) is a schematic cross-sectional view of a through-electrode and a neighboring portion of the semiconductor element according to the first embodiment of the present invention, taken along a plane including the thickness of the semiconductor substrate.
Figure 2B:
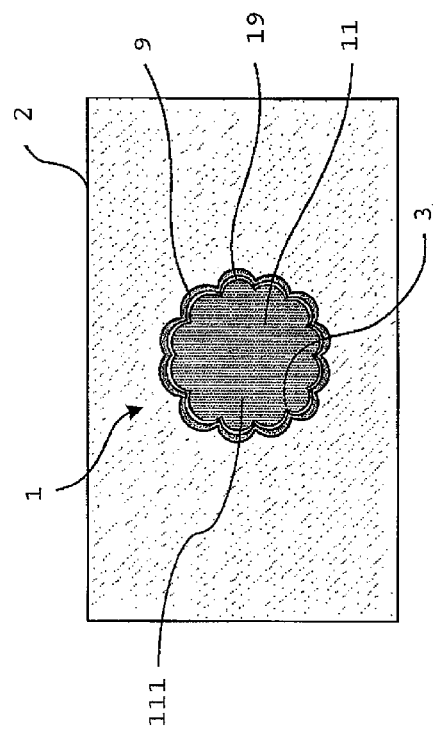
FIG. 2(B) is a schematic cross-sectional view of the through-electrode and the neighboring portion of the semiconductor element according to the first embodiment of the present invention, taken along a plane orthogonal to the thickness of the semiconductor substrate.

FIG. 2(A) is a schematic cross-sectional view of a through-electrode 111 and a neighboring portion of the semiconductor element according to the first embodiment of the present invention, taken along a plane including the thickness of the semiconductor substrate 2. FIG. 2(B) is a schematic cross-sectional view of the through-electrode 111 and the neighboring portion of the semiconductor element according to the first embodiment of the present invention, taken along a plane orthogonal to the direction of the thickness of the semiconductor substrate 2.

In order to facilitate the understanding, like components having like functions are labeled with like reference numerals herein and the drawings are somewhat exaggerated.

First, a configuration of the semiconductor element according to the present embodiment will be described in conjunction with a method to fabricate the semiconductor element.

A specific description of the shape of the through-hole 1 and a method to form the through-hole 1 will be provided later.

The through-hole 1 is formed in the semiconductor substrate 2 and has a concavo-convex structure 3 having stripes on its sidewall. The through-hole 1 is formed by a dry etching method of the material of the semiconductor substrate 2 on which an etching mask is formed.

In the dry etching method of the present embodiment, an etching mask is formed on the material of the semiconductor substrate 2 and the material of the semiconductor substrate 2 on which the etching mask is formed is etched by using an etching gas containing $O_2$ (oxygen) gas.

The stripes of the concavo-convex structure 3 are formed in the direction of the thickness of the semiconductor substrate 2. The concavo-convex structure 3 is formed by using the indentations of the edge of an etching window opened in the etching mask.

A circuit element 6 (see FIG. 13) is disposed on the semiconductor substrate 2 made of a silicon system semiconductor such as silicon or silica-germanium. The through-hole 1 is filled with a conductive material 11 (see FIGS. 2(A) and 2(B)), which is electrically connected to an electrode of the circuit element 6.

A first insulating layer 9 is deposited on the sidewall of the through-hole 1 by CVD and a seed layer 19 is formed on the first insulating layer 9 (see FIGS. 2(A) and 2(B)). The through-hole 1 is filled with the conductive material 11, which is Cu (copper), by plating to form a through-electrode 111 penetrating the semiconductor substrate 2.

Figure 13:
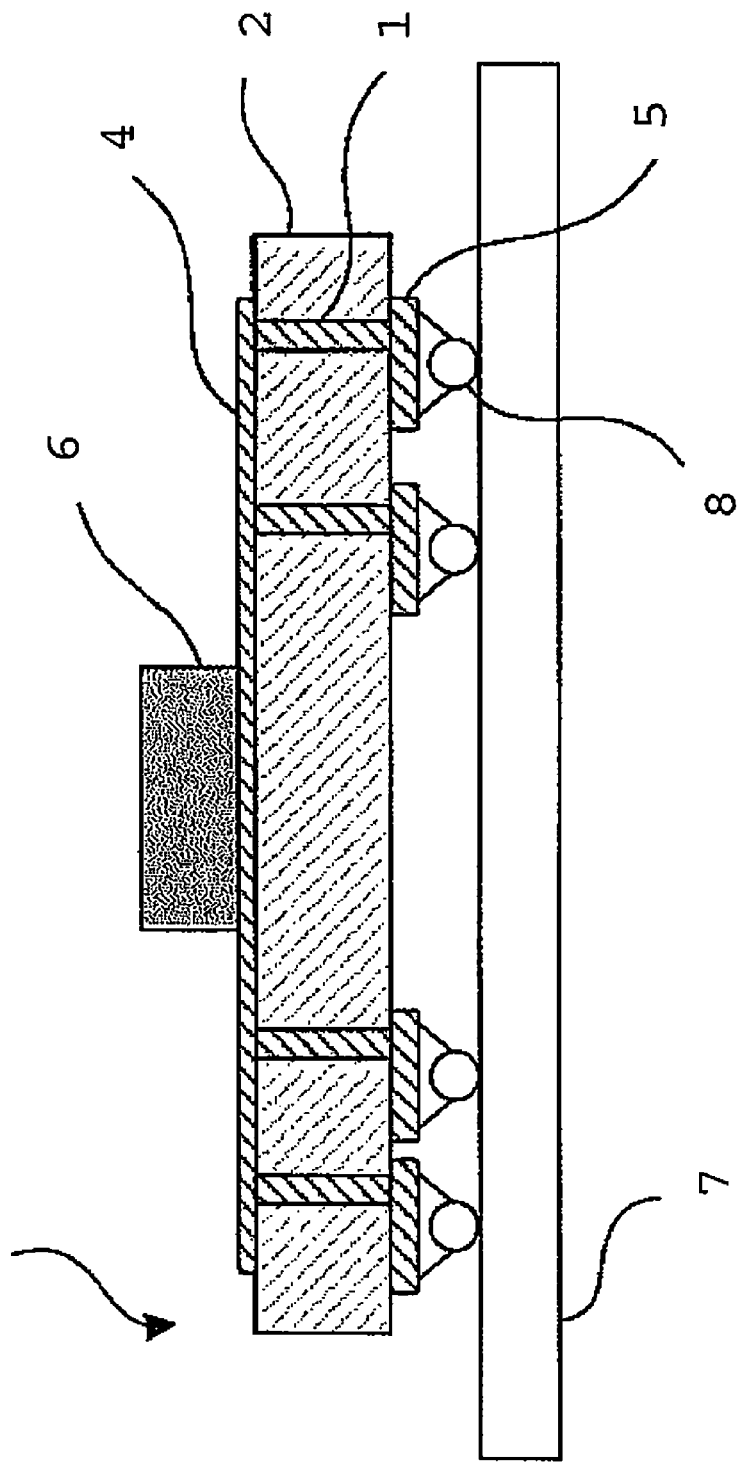
FIG. 13 is a schematic cross-sectional view of a through-electrode and a neighboring portion of a conventional semiconductor element, taken along a plane including the thickness of the semiconductor substrate.

A first wiring layer 4 (see FIG. 2(A)) is formed at one end of the through-electrode 111 and is electrically connected to the circuit element 6 (see FIG. 13).

A second wiring layer 5 (see FIG. 2(A)) is formed on the other end of the through-electrode 111 and is electrically connected to an external circuit 7 (see FIG. 6) through a terminal such as a solder ball 8.

A second insulating layer 10 is formed on the upper surface of the semiconductor substrate 2 so as to insulate the first wiring layer 4 from the semiconductor substrate 2.

A third insulating layer 110 is formed on the lower surface of the semiconductor substrate 2 so as to insulate the second wiring layer 5 from the semiconductor substrate 2.

The shape of the through-hole 1 formed by the dry etching method according to the present embodiment will be described below in further detail.

The through-hole 1 has a diameter in the range from approximately 5 μm to approximately 200 μm and a depth in the range from approximately 10 μm to approximately 400 μm.

The distance D between adjacent stripes of the concavo-convex structure 3 formed by using the indentations of the edge of the etching window of the etching mask (see FIG. 1(B)) is approximately 10 μm or less.

The distance D and the height H of the stripes of the concavo-convex structure 3 (see FIG. 1(B)) may be larger or smaller than depicted in FIGS. 1(A) and 1(B).

Figure 3A:
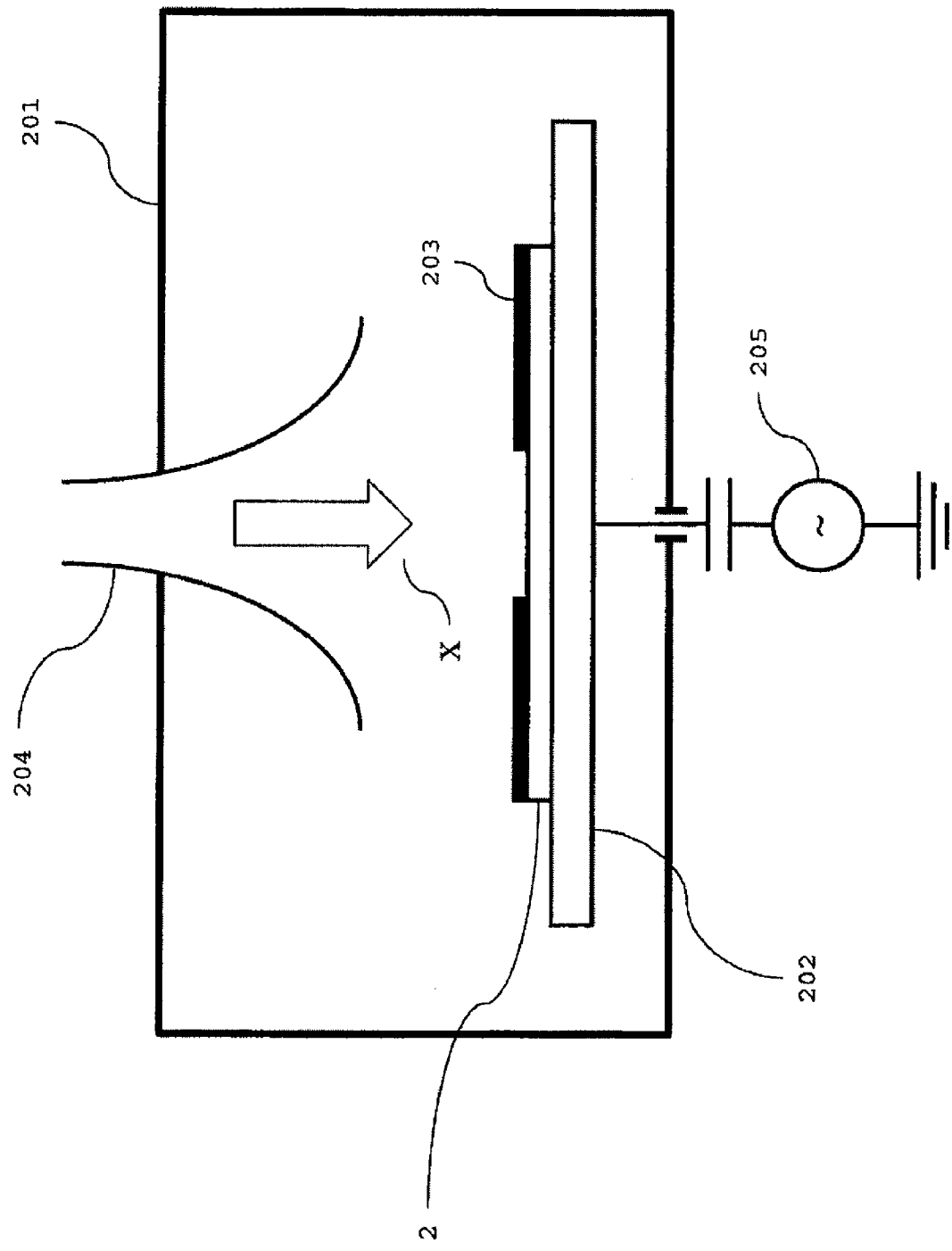
FIG. 3(A) is a diagram illustrating an etching chamber used in a dry etching method in the first embodiment of the present invention.
Figure 3B:
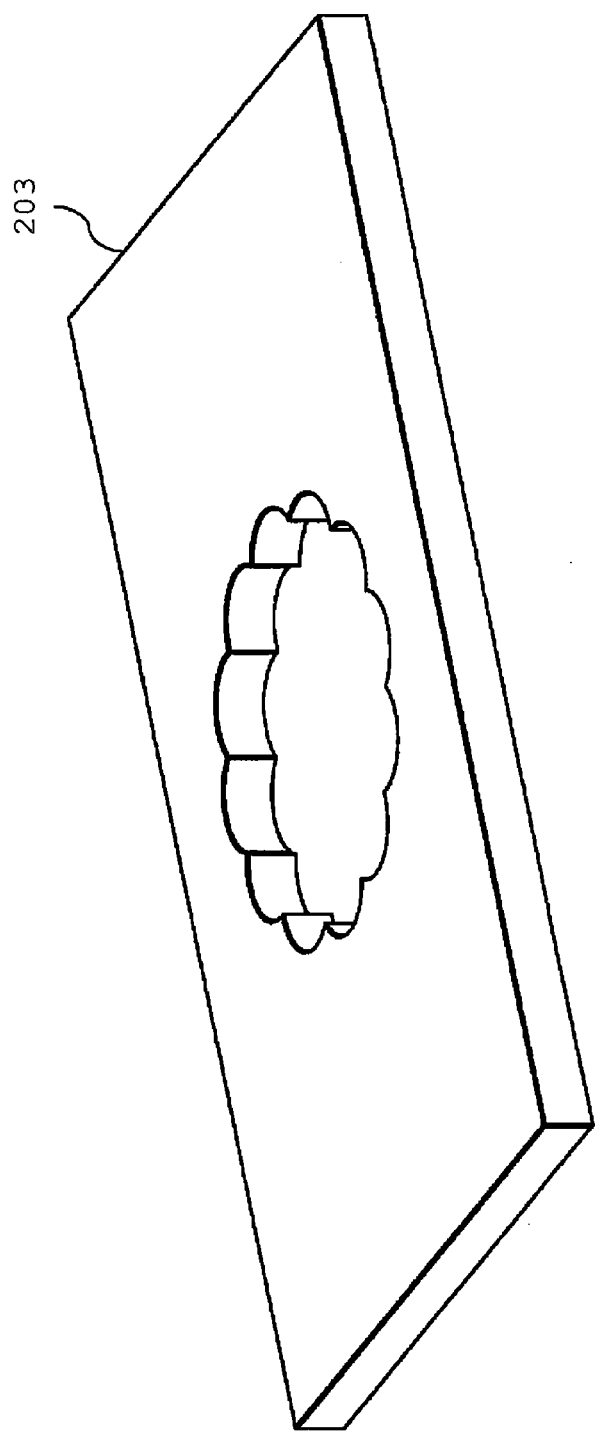
FIG. 3(B) is a schematic perspective view of an etching mask used in the dry etching method in the first embodiment of the present invention.

Referring to FIGS. 3(A) and 3(B), the method to form the through-hole 1 by the dry etching method according to the present embodiment will be described in further detail.

FIG. 3(A) is a diagram illustrating an etching chamber used in the dry etching method in the first embodiment of the present invention.

An etching mask 203 (see FIG. 3(B)) having an etching window with the shape of the aperture of the through-hole 1 (see FIG. 1(B)) is formed on the material of the semiconductor substrate 2 placed on a substrate electrode 202 inside a chamber 201 at a pressure in the range from 5 to 50 Pa.

PR (photoresist), which is a masking material of the etching mask 203, is an organic material containing carbon.

A high-frequency generator (not shown) that generates a high-frequency wave at a frequency of 13.56 MHz is used to generate plasma at an output power in the range from 1,000 to 4,000 W to dissociate $SF_6$ gas, which is an etching gas.

The plasma is introduced into the chamber 201 in the direction indicated by arrow X by using a surfatron 204.

In the present embodiment, $SF_6$ gas at a flow rate of 84.5 times $10^{-4}$ to 845 times $10^{-4}$ Pa m³/sec, that is, 50 to 500 sccm (standard cc/min), is mixed with $O_2$ gas at an equal or lower flow rate to reduce the partial pressure of the $SF_6$ gas to reduce the number of F radicals in the plasma.

In order to suppress etching of the sidewall of the through-hole 1, the number of F radicals that diffuse in all directions because of the lack of charge and accelerate the etching of the sidewall of the through-hole 1 is reduced.

By increasing the ratio of F ions to F radicals in this way, plasma with a higher ionicity than plasma used in the conventional dry etching methods is generated.

Of course, plasma may be generated inside the chamber 201 by the ICP (Inductively Coupled Plasma) method, the RIE (Reactive Ion Etching) method, the ECR (Electron Cyclotron Resonance) method or the like instead of being introduced from the outside as described above.

The high-frequency generator 205 is used to apply a substrate bias to the semiconductor substrate 2 placed on the substrate electrode 202 at an output power in the range from 20 to 200 W to accelerate charged F ions in the direction of the thickness of the semiconductor substrate 2. F ions, which have increased in number because of the decrease of the number of F radicals as just described, are accelerated toward the bottom of a hole formed in the process of forming the through-hole 1 and collide against the bottom to further etch the semiconductor substrate 2 in the direction of the thickness of the semiconductor substrate 2.

Thus, etching of the sidewall of the through-hole 1 can be suppressed while at the same time etching in the direction of the thickness of the semiconductor substrate 2 can be continuously performed, that is, without repeatedly alternating between the etching step and the deposition step as in the Bosch process described above.

The amount of $O_2$ mixed in the etching gas should be properly adjusted since an excessive amount of $O_2$ in the etching gas will reduce the number of highly reactive F radicals that make a major contribution to etching and therefore will reduce the etching rate.

As has been described above, an organic material containing carbon is used as the PR, which is a mask material of the etching mask 203.

$O_2$ gas contained in the $SF_6$ gas slightly etches the PR.

Therefore the carbon contained in the etched PR forms a deposition component and is deposited on the sidewall of the through-hole 1 to form a passivation film.

The passivation film deposited in the course of etching in this way suppresses etching of the sidewall of the through-hole 1.

In this way, etching of the sidewall of the through-hole 1 can also be suppressed by the passivation film while etching in the direction of the thickness of the semiconductor substrate 2 can proceed.

Since the present embodiment does not use the deposition step as described above, a bellows-like concavo-convex structure 3a called scallop (see FIGS. 14(A) and 14(B)) having lateral stripes which would be generated by repeatedly alternating between steps of etching and deposition is not generated.

In this way, a concavo-convex structure 3 having stripes in the direction of the thickness of the semiconductor substrate 2 can be formed by using the indentations of the edge of the etching window of the etching mask 203. The locations where the stripes of the concavo-convex structure 3 are formed are of course determined by the shape of the indentations of the edge of the etching window of the etching mask 203.

The surface roughness of the sidewall of the through-hole 1, that is, the height H of the stripes of the concavo-convex structure 3 (see FIG. 1(B)), is preferably equal to or less than the distance D between adjacent stripes of the concavo-convex structure 3 (see FIG. 1(B)).

A higher degree of adhesion can be provided by choosing the distance D between adjacent stripes of the concavo-convex structure 3 (see FIG. 1(B)) to be 2 μm or less.

The vertical stripes as described above improve the degree of adhesion of the first insulating layer 9 and the seed layer 19 to the sidewall. When the first insulating layer 9 and the seed layer 19 are formed, the materials of the first insulating layer 9 and the seed layer 19 are diffused downward from above the through-hole 1. Lateral stripes which would be generated in the Bosch process would impede the diffusion, whereas the vertical stripes do not. That is, insulating film molecules of the material of the first insulating layer 9 are uniformly diffused during formation of the insulating film by CVD and metal sputtering ions are uniformly diffused during formation of the seed layer 19 by sputtering.

After the concavo-convex structure 3 is formed, wet treatment or plasma treatment using an inert gas such as Ar, or $N_2$ (nitrogen) gas, for example, is applied to improve the adhesion of the first insulating layer 9 and the seed layer 19 to the sidewall of the through-hole 1. Therefore, a through-electrode 111 having a stable performance can be provided and the reliability of the semiconductor element can be improved.

Accordingly, the reliability of a semiconductor chip using the semiconductor element can also be improved and the semiconductor element also helps reduce the size of a semiconductor device and in applications of the stacked chip layering technology.

Figure 4:
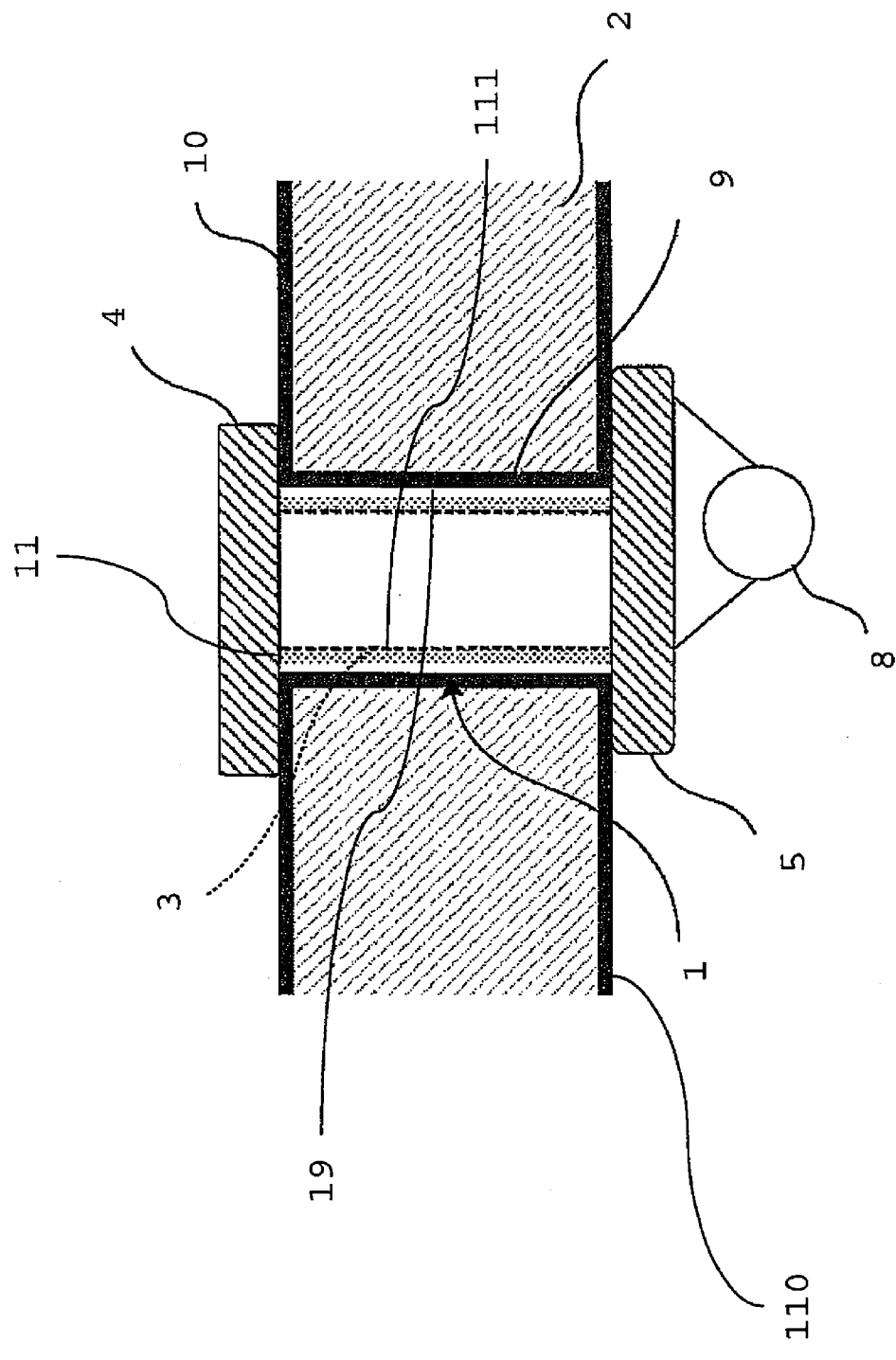
FIG. 4 is a schematic cross-sectional view of the through-electrode and the neighboring portion of the semiconductor element according to the first embodiment of the present invention in which a conductive material is formed only on the surface of the sidewall of the through-hall, taken along a plane including the thickness of the semiconductor substrate.

Since the concavo-convex structure 3 can suppress reduction of adhesion of the first insulating layer 9 and the seed layer 19 to the sidewall of the through-hole 1, the concavo-convex structure 3 is advantageous especially when a conductive material 11 is formed only on the surface of the sidewall of a through-hole 1 with the aim of suppressing reduction in productivity as shown in FIG. 4.

FIG. 4 is a schematic cross-sectional view of a through-electrode 111 and a neighboring portion of a semiconductor element in which a conductive material 11 is formed only on the surface of the sidewall of the through-hole 1 according to the first embodiment of the present invention, taken along a plane including the thickness of the semiconductor substrate 2.

If a through-hole 1 has a rather large volume, for example 100 μm across and as deep as 200 μm, it would take as much as about 3 to 4 hours to completely fill the through-hole 1 with a conductive material 11 by plating from the upper surface of the semiconductor substrate 2 to the lower surface of the semiconductor substrate 2 (see FIGS. 2(A) and 2(B)).

Therefore, the conductive material 11 is formed only partially in the through-hole 1 to suppress reduction in productivity as shown in FIG. 4.

If the conductive material 11 is formed only partially in the through-hole 1 in this way, a moisture can penetrate the sidewall of the through-hole 1 through the seed layer 19 and the adhesion of the first insulating layer 9 and the seed layer 19 to the sidewall of the through-hole 1 can be decreased.

However, the concavo-convex structure 3 according to the embodiment can suppress such reduction of adhesion and therefore ensure the reliability of the semiconductor element while suppressing the reduction in productively.

Second Embodiment

A semiconductor element and a method to fabricate the semiconductor element according to a second embodiment will be described with reference to the drawings, in particular FIGS. 5 to 7.

Figure 5:
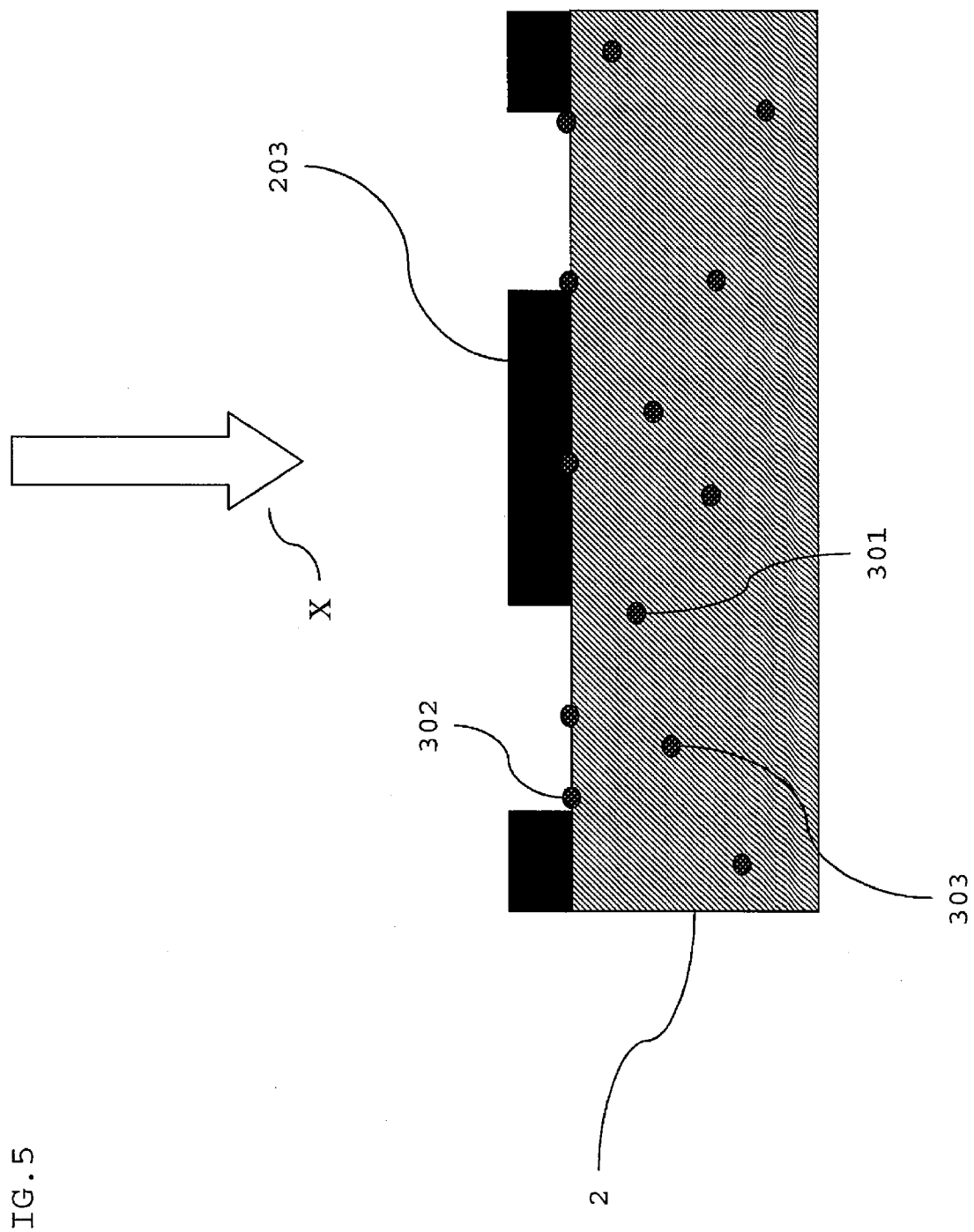
FIG. 5 is a schematic cross-sectional view of a material of a semiconductor substrate according to a second embodiment of the present invention, taken along a plane including the thickness of the semiconductor substrate.

FIG. 5 is a schematic cross-sectional view of a semiconductor substrate 2 according to the second embodiment of the present invention, taken along a plane including the thickness of the semiconductor substrate 2.

Figure 6:
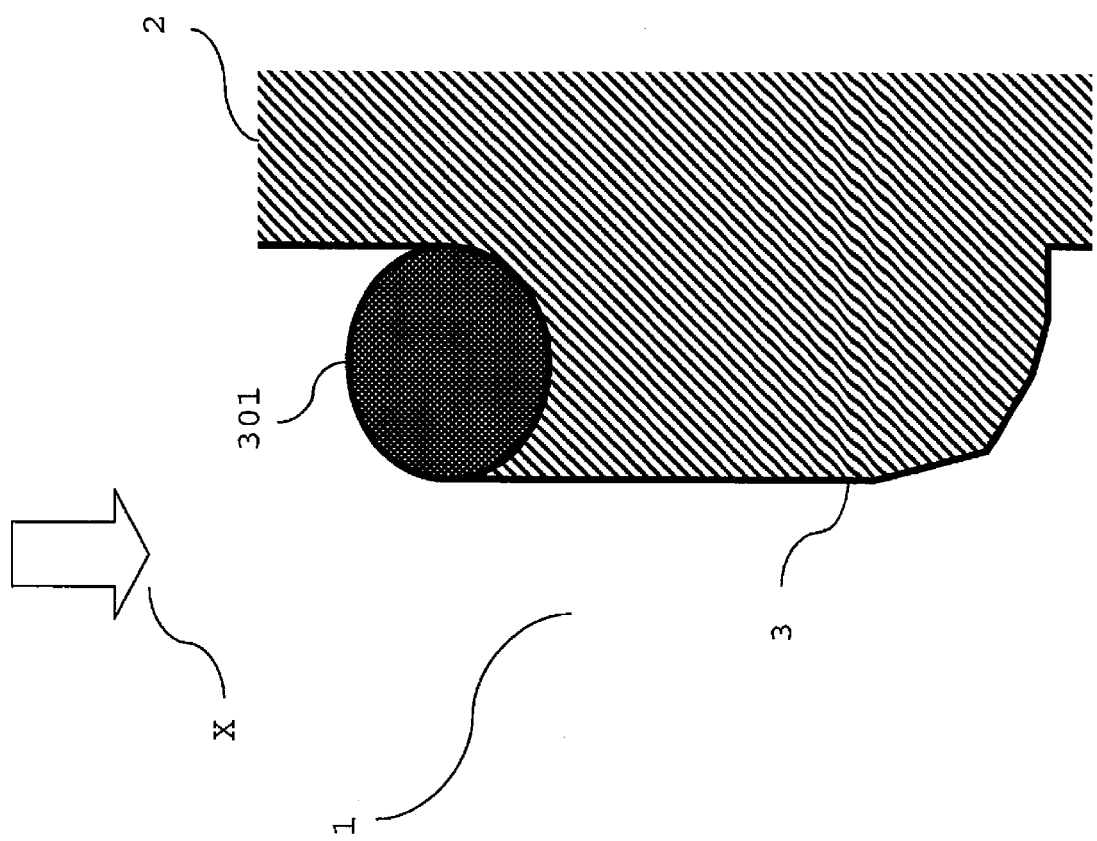
FIG. 6 is a schematic partial cross-sectional view of a through-hole having a concavo-convex structure on its sidewall according to the second embodiment of the present invention, taken along a plane including the thickness of the semiconductor substrate.

FIG. 6 is a schematic partial cross-sectional view of a though-hole 1 having a concavo-convex structure 3 on its sidewall according to the second embodiment of the present invention, taken along a plane including the thickness of the semiconductor substrate 2.

Figure 7:
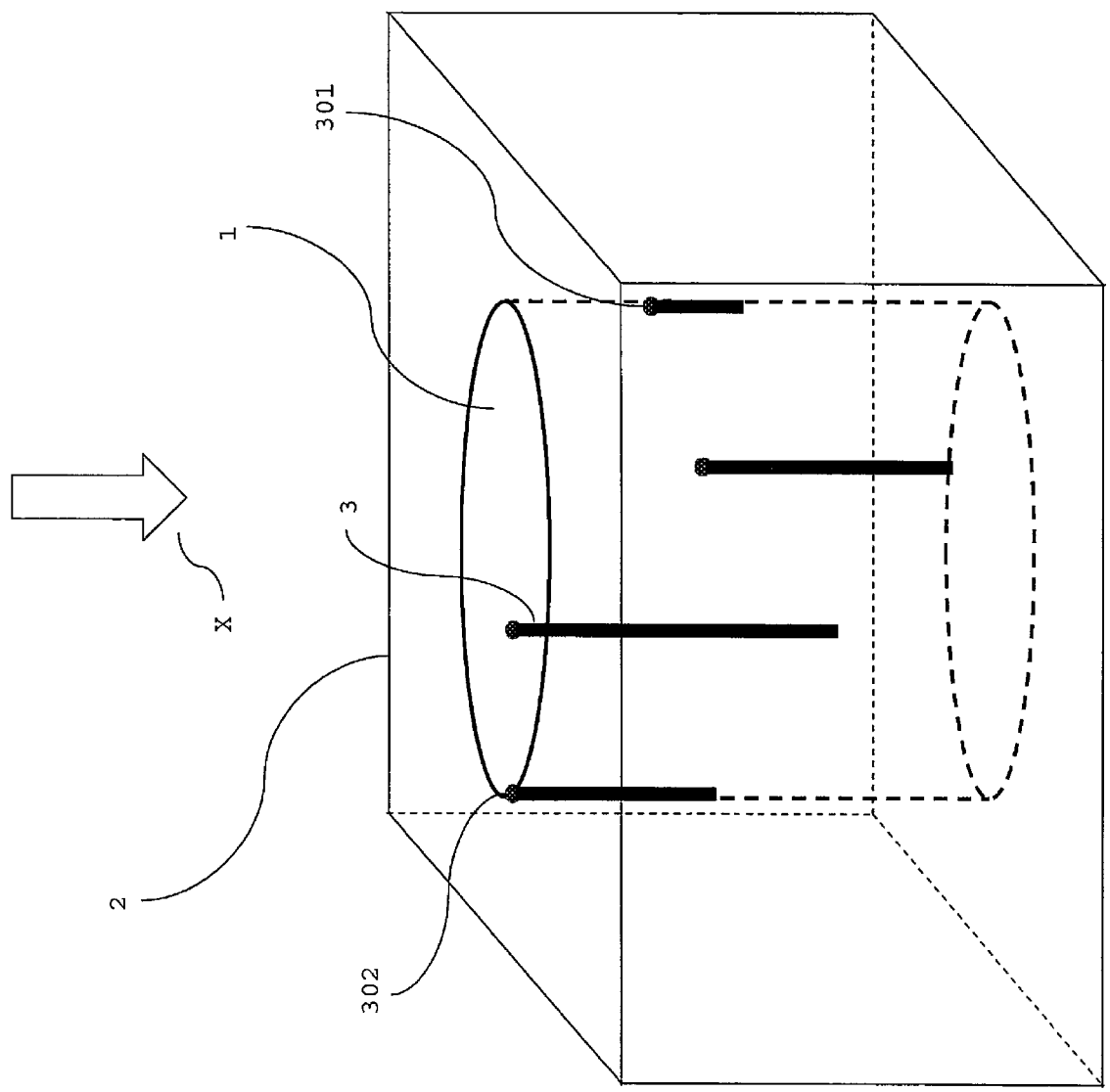
FIG. 7 is a schematic perspective view of the through-hole having the concavo-convex structure on its sidewall according to the second embodiment of the present invention.

FIG. 7 is a schematic perspective view of the through-hole 1 having the concavo-convex structure 3 on its sidewall according to the second embodiment of the present invention.

The semiconductor element and the semiconductor fabrication method according to the second embodiment are similar to those of the first embodiment.

The second embodiment differs from the first embodiment in how to form the concavo-convex structure 3.

The concavo-convex structure 3 in the first embodiment described above is formed by using the indentations of the edge of the etching window of the etching mask 203 used in a dry etching method. In the second embodiment, the concavo-convex structure 3 is formed by positively using impurities contained in the surface or inside of the material of the semiconductor substrate 2.

Since a group 14 element such as Si or Ge (germanium) is used as an intrinsic semiconductor, a group 13 element such as B (boron), Al (aluminium), Ga (gallium) or In (indium) is used as an impurity when a p-type semiconductor is required, while a group 15 element such as P (phosphorus), As (arsenic), or Sb (antimony) is used as an impurity when an n-type semiconductor is required. Furthermore, an isotope or an oxide of Si, Ge and the like is also used as an impurity. Furthermore, the deposition component, which the above-described carbon contained in the etched PR forms, and the like also functions as an impurity.

The difference between the second embodiment and the first embodiment described above will be clarified below.

If the material of the semiconductor substrate 2 contains impurities 301, 302 and 303 that are resistant to etching in its surface or inside as shown in FIG. 5, the portions under the impurities 301, 302, and 303 in etching windows of an etching mask 203 are hard to etch in the direction of the thickness of the semiconductor substrate.

More specifically, because a substrate bias is applied to the semiconductor substrate 2 as described above, charged F ions are accelerated in the direction of the thickness of the semiconductor substrate 2. That is, many of the abundant F ions collide against the semiconductor substrate 2 from above, that is, in the direction indicated by arrow X.

On the other hand, F radicals which carry no charge diffuse not only in the direction indicated by arrow X but in all directions. Some of them collide against the semiconductor substrate 2 in the direction different from the direction indicated by arrow X.

Thus, F ions and F radicals collide against the semiconductor substrate 2 from above like falling rain.

Impurities 301 and 302 near the locations where the sidewall of a through-hole 1 are to be formed act as if canopies. That is, just as few raindrops pound on an area under a canopy, few F ions and F radical collide against locations immediately under impurities 301 and 302.

This will be described more specifically with respect to an impurity 301 contained inside the material of the semiconductor substrate 2. Because F ions collide against the semiconductor substrate 2 in the direction indicated by arrow X as shown in FIG. 6, the portion above the impurity 301 is etched.

However, few F ions and F radicals collide against the portion under the impurity 301 because the impurity 301 acts as if a canopy as described above. Accordingly, the portion is not etched and left on the sidewall.

As a result, portions under impurities 301 and 302 close to locations where sidewall of the through-hole 1 is to be formed are left on the sidewall of the through-hole 1 as vertical stripes as shown in FIG. 7.

The second embodiment positively uses the phenomenon in which unetched portions are left on the sidewall of the through-hole 1 to form a concavo-convex structure 3 having stripes in the direction of the thickness of the semiconductor substrate 2, thereby improving the adhesion of the first insulating layer 9 and the seed layer 19 to the sidewall of the through-hole 1.

Figure 8:
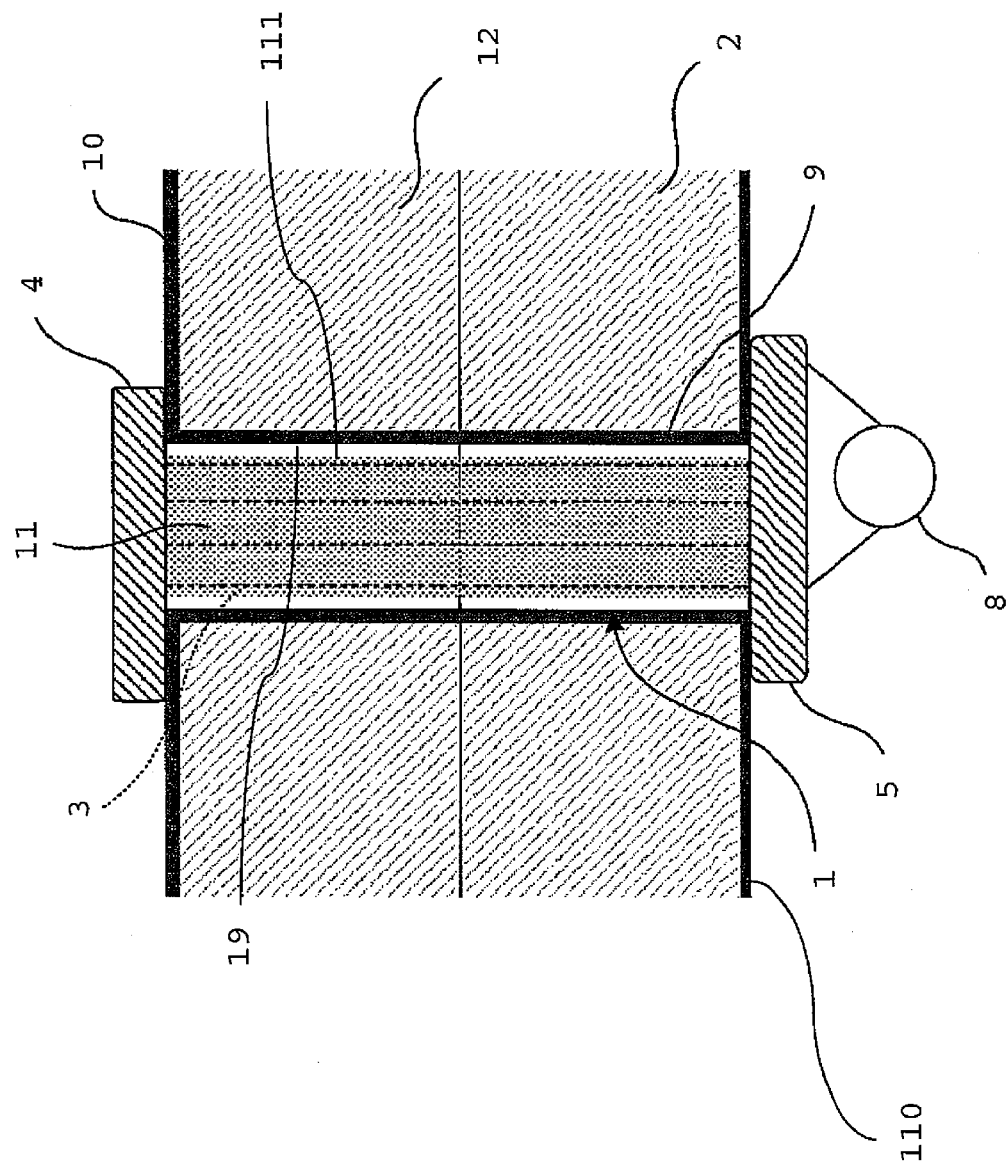
FIG. 8 is a schematic cross-sectional view of a through-electrode and a neighboring portion of a semiconductor element according to an embodiment of the present invention, taken along a plane including the thickness of a two-layered semiconductor substrate.

While the semiconductor substrates 2 in the first and second embodiments described above consist of only one layer, two semiconductor substrate layers 2 and 12 may be used as shown in FIG. 8.

FIG. 8 is a schematic cross-sectional view of a through-electrode 111 and a neighboring portion of a semiconductor element in such an embodiment of the present invention, taken along a plane including the thicknesses of the two semiconductor substrate layers 2 and 12.

More specifically, a through-hole 1 is formed in the semiconductor substrate 2 by a dry etching method, a first insulating layer 9 is deposited on the sidewall of a through-hole 1 by CVD, and a seed layer 19 is formed on the insulating layer 9, as described with respect to the first embodiment.

The semiconductor substrate 12, which has the same configuration as the semiconductor substrate 2, is stacked on the semiconductor substrate 2 with solders, a Cu plating layer, and a wiring layer or the like (not shown) between the substrates 2 and 12.

The through-hole 1 is filled with a conductive material 11 by plating to form a through-electrode 111 that penetrates the first and second semiconductor substrates 2 and 12. A first wiring layer 4 formed on the semiconductor substrate 12 is electrically connected to a second wiring layer 5 formed on the semiconductor substrate 2.

Of course, three or more semiconductor substrates can be stacked in the same way as two semiconductor substrates 2 and 12 are stacked.

During fabrication of such a multilayer substrate consisting of a stack of layers or mounting a fabricated multilayer substrate on an external circuit 7 (see FIG. 13) being another circuit substrate, an impact is applied to the through-electrode 111 and stresses are applied to the seed layer 19 and the first insulating layer 9. As a result, the degree of adhesion of the first insulating layer 9 and the seed layer 19 to the sidewall can be reduced.

Very advantageously, the concavo-convex structure 3 of any of the embodiments can suppress such reduction in adhesion of the first insulating layer 9 and the seed layer 19 to the sidewall of the through-hole 1 because the conductive material 11 somewhat expands and contracts in the direction of penetration of the through-hole 1 under such cases.

Further, the relationships between the size and/or shape of the stripe-like concavo-convex structure, and (1) the degree of vacuum in the chamber used in the dry etching method, (2) the kind and/or the amount of a gas mixed in the etching gas in order to adjust the partial pressure of the etching gas in the chamber, (3) the level of the substrate bias applied to the material of the semiconductor substrate 2, (4) the size and/or the shape of an etching window of an etching mask 203 used in the dry etching method, and (5) impurities contained in the material of the semiconductor substrate 2, may be examined beforehand, and on the basis of the results of the examination, the degree of vacuum in the chamber, the kind and/or the amount of the gas to be mixed, the level of the substrate bias to be applied, and the size and/or the shape of the etching window, may be set.

More specifically, as the degree of vacuum in the chamber is decreased, or the partial pressure of $SF_6$ gas is increased by reducing the amount of a gas mixed in $SF_6$ gas to increase the ratio of the $SF_6$ gas to $O_2$ gas, or the substrate bias is decreased, for example, the number of F radicals that cause etching of the sidewall of the through-hole 1 increases. Therefore, the height H of the stripes of the concavo-convex structure 3 may be decreased and the distance D between adjacent stripes of the concavo-convex structure 3 (see FIG. 1(B)) may be increased.

The number of highly reactive F radicals that make a major contribution to etching decreases and accordingly the etching rate decreases as the degree of vacuum in the chamber is increased, or the partial pressure of $SF_6$ gas is decreased, or the substrate bias is increased. Therefore, these parameters need to be appropriately adjusted.

Here, the kinds of impurities are usually predetermined according to the required semiconductor such as a p-type semiconductor or an n-type semiconductor. Thus, setting the amount or the distribution of the impurities, for example, to obtain desired concavo-convex structures is not a realistic idea. But it is significant to carry out examinations beforehand to know the relationships between the size and/or shape of the concavo-convex structure, and the various conditions including the impurities. This is because one can anticipate, base on the examination data, possible reductions in adhesion to the sidewall of the through-hole 1 to suppress such reductions in adhesion by setting the other conditions accordingly.

A gas for depositing a product of reaction on the sidewall of the through-hole 1 may be added to the etching gas.

More specifically, addition of a gas such as $CHF_3$ (trifluoromethane) gas or $SiF_4$ (silicon tetrafluoride) gas that causes a product of reaction to be deposited on the sidewall of the through-hole 1 will retard etching of the sidewall of the through-hole 1 and therefore can suppress reduction in the height H of the stripes of the concavo-convex structure 3 due to the etching of the stripes.

The depth in the through-hole 1 at which the concavo-convex structure 3 is to be formed can be controlled by controlling the degree of vacuum in the chamber, the partial pressure of $SF_6$ gas, and the substrate bias, for example.

More specifically, the concavo-convex structure 3 may be formed along the entire depth of the through-hole 1 from the upper surface of the semiconductor substrate 2 to the lower surface of the semiconductor substrate 2 (see FIG. 1(A)), or may be formed only in the vicinity of an aperture of the through-hole 1.

The area and/or shape of a cross-section of the through-hole 1 taken along a plane orthogonal to the direction of the thickness of the semiconductor substrate 2 can be controlled according to the depth in the through-hole 1 by controlling the degree of vacuum in the chamber, the partial pressure of $SF_6$ gas, and the substrate bias, for example.

Figure 9:
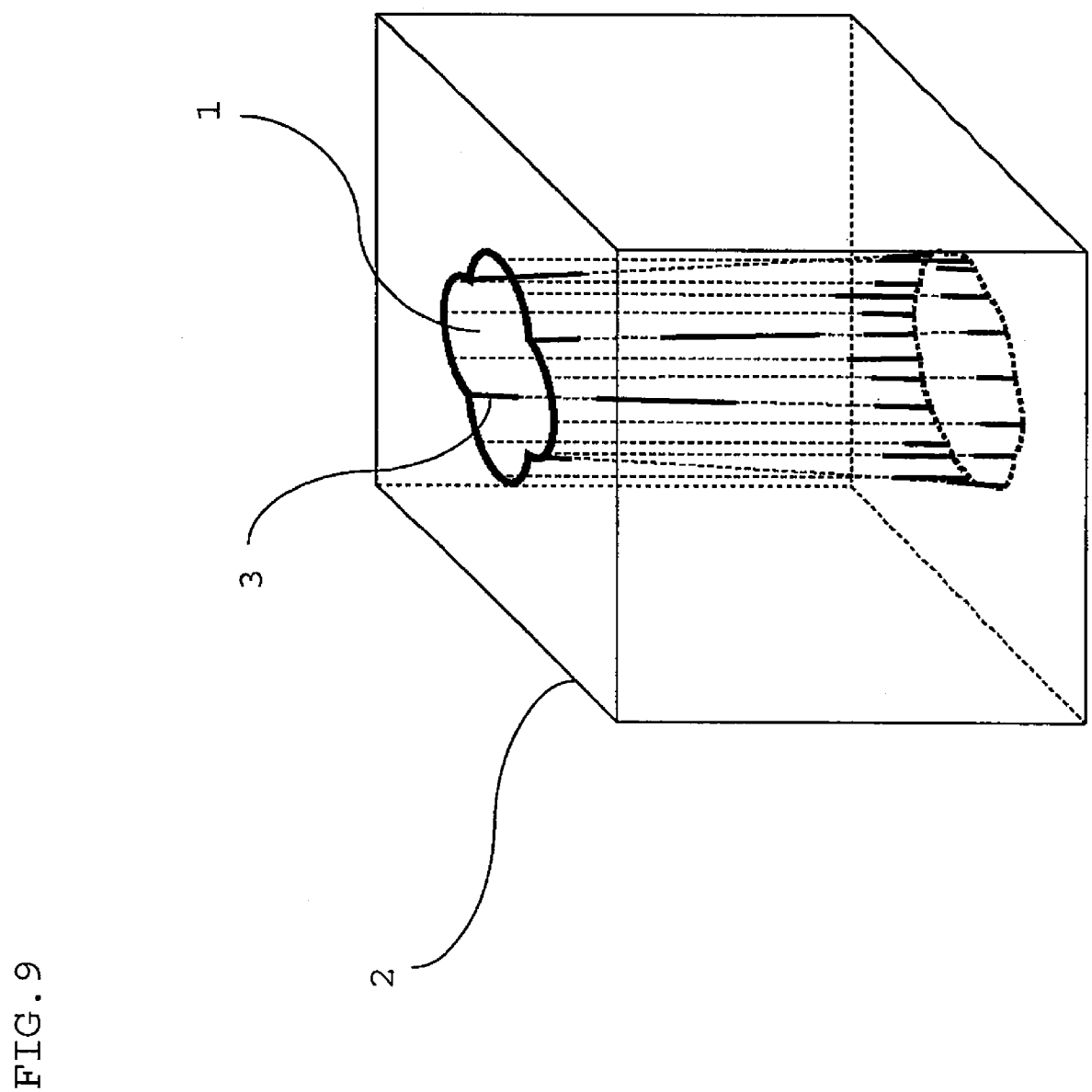
FIG. 9 is a schematic perspective view of a through-hole of a semiconductor element according to an embodiment of the present invention in which the number of stripes and period of the concavo-convex structure vary with the depth.

More specifically, the number and the period of the stripes of the concavo-convex structure 3 may vary with the depth in the through-hole 1 as shown in FIG. 9. The diameter of the aperture of the through-hole 1 at the upper surface of the semiconductor substrate 2 may be larger than the diameter of the aperture of the through-hole 1 at the lower surface of the semiconductor substrate 2 as shown in FIG. 10.

FIG. 9 is a schematic perspective view of a through-hole 1 of a semiconductor element according to an embodiment of the present invention in which the number and the period of the stripes of the concavo-convex structure 3 vary with the depth in the through-hole 1.

Figure 10:
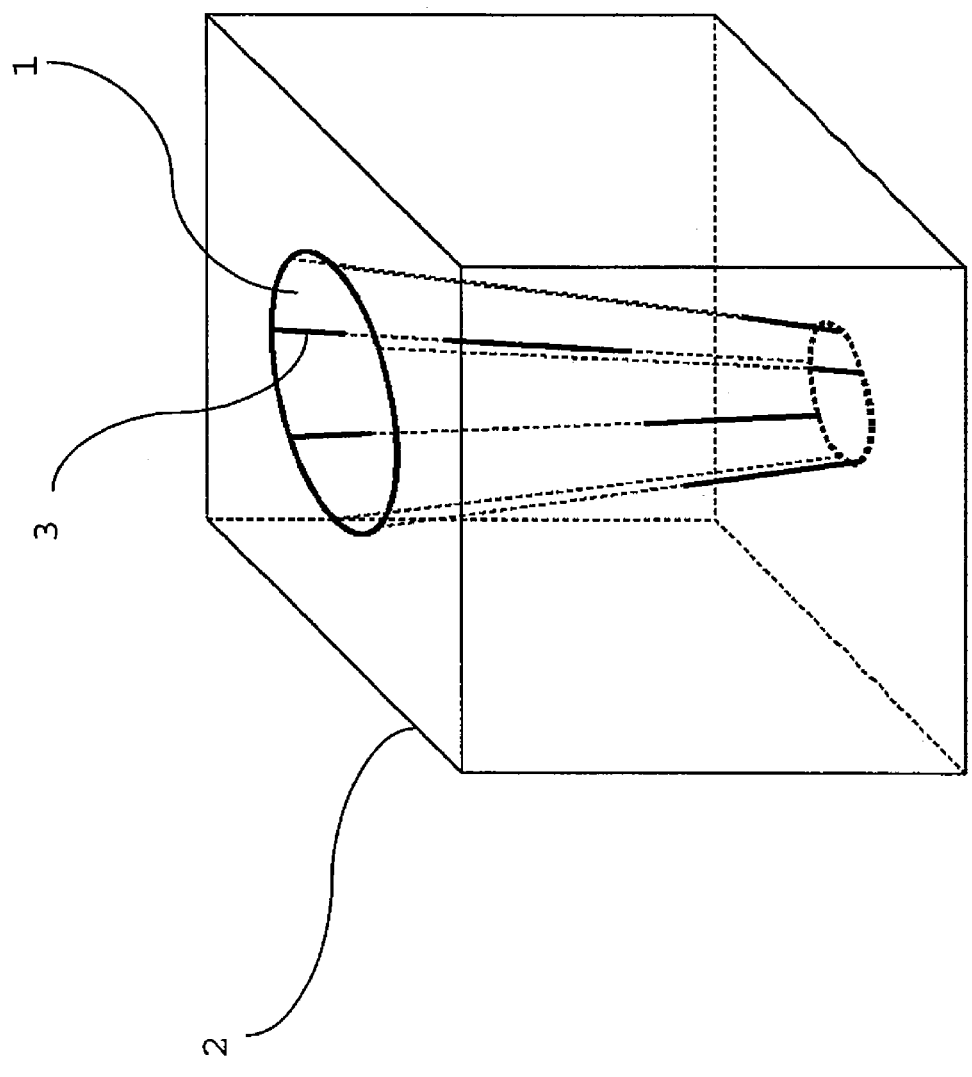
FIG. 10 is a schematic perspective view of a through-hole of a semiconductor element according to an embodiment of the present invention in which the diameter of the aperture of the through-hole at the upper surface of the semiconductor substrate is greater than the diameter of the aperture of the through-hole at the lower surface of the semiconductor substrate.

FIG. 10 is a schematic perspective view of a through-hole 1 of a semiconductor element according to an embodiment of the present invention in which the diameter of the aperture of the through-hole 1 at the upper surface of the semiconductor substrate 2 is larger than the diameter of the aperture at the lower surface of the semiconductor substrate 2.

The through-hole 1 may be formed normal to the direction of the thickness of the semiconductor substrate 2 (see FIG. 1(A)), or may be formed at an angle with respect to the thickness of the semiconductor substrate 2, or may be branched.

Figure 11:
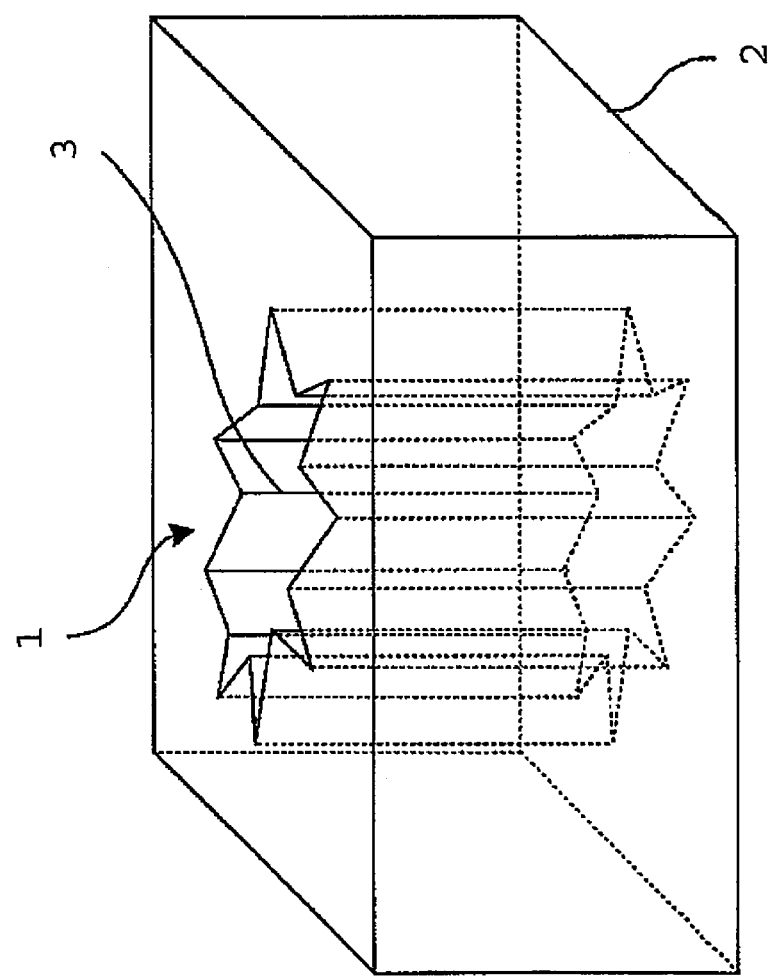
FIG. 11 is a schematic perspective view (No. 1) of a through-hole of a semiconductor element according to an embodiment of the present invention in which the apertures of the through-hole have a shape formed by connecting portions of polygons.
Figure 12:
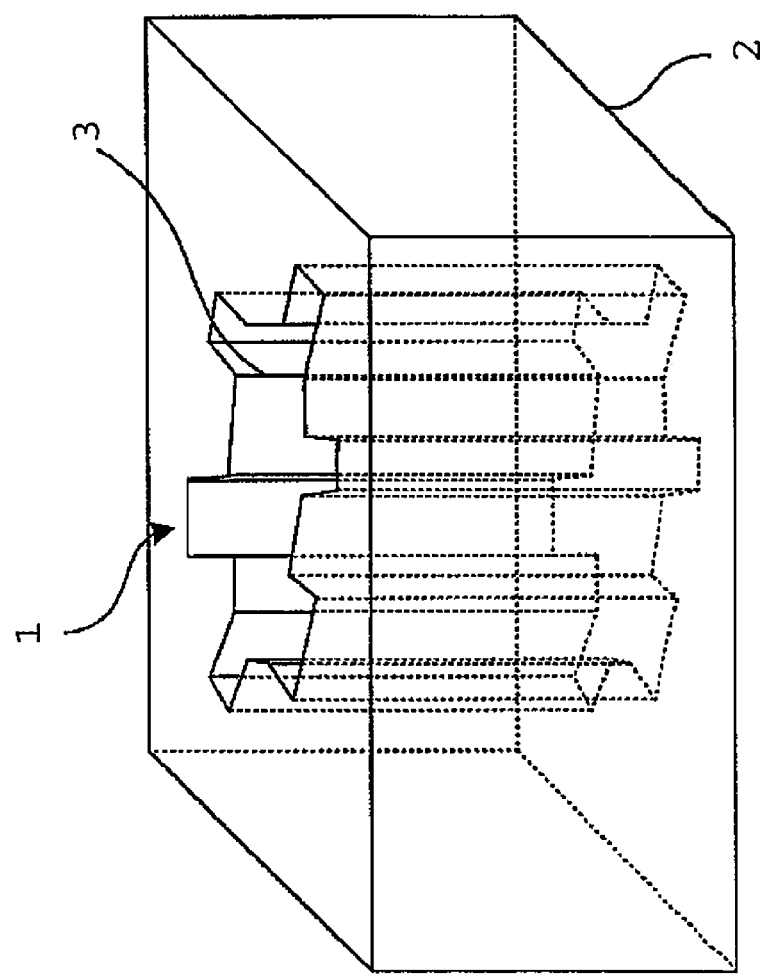
FIG. 12 is a schematic perspective view (No. 2) of a through-hole of a semiconductor element according to an embodiment of the present invention in which the apertures of the through-hole have another shape formed by connecting portions of polygons.

The aperture of the through-hole 1 may have a shape formed by connecting portions of arcs (see FIGS. 1(A) and 1(B)), or may be a perfect circle or an ellipse, or a polygon, or may be a shape formed by connecting portions of polygons as shown in FIGS. 11 and 12, or may be a shape formed by connecting curves and line segments.

FIG. 11 is a schematic perspective view (No. 1) of a through-hole 1 of a semiconductor element in an embodiment of the present invention in which the aperture of the through-hole 1 has a shape formed by connecting portions of polygons.

FIG. 12 is a schematic perspective view (No. 2) of another through-hole 1 of a semiconductor element in an embodiment of the present invention in which the aperture of the through-hole 1 has a shape formed by connecting portions of polygons.

The first insulating layer 9 may be formed by other method such as a thermal oxidation method or a spin coat method, instead of CVD.

The first insulating layer 9 may be made of a material such as a silicon oxide, silicon nitride, or a carbon system polymer.

The conductive material 11 may be filled by a printing or inkjet method instead of plating. If a printing or inkjet method is used, the seed layer 19 may be omitted.

The conductive material 11 may be copper, tungsten, gold, aluminum, nickel, polysilicon, or an alloy of any of these, or may be a conductive resin containing particles of a metal such as silver or copper, or may be a low melting metal such as tin or an alloy containing tin, or indium or an alloy containing indium.

Electrodes other than the first wiring layer 4, the second wiring layer 5, and the through-electrodes 111 penetrating the semiconductor substrate 2 may be made of a material such as aluminum, copper, gold or tungsten, or an alloy of any of these.

A diffusion barrier film (not shown) made of a titan, titan tungsten, titan nitride, or tantalum nitride may or may not be formed between the seed layer 19 made of a material such as copper and the first insulating layer 9.

Wiring may be provided by using the second wiring layer 5 or by using direct wiring to an external circuit 7 (see FIG. 6) through solder balls 8 or the like.

The semiconductor substrate 2 may be made of a silicon system semiconductor such as silicon or silica-germanium, or a compound semiconductor such as gallium arsenide, gallium nitride or indium phosphorus.

The semiconductor element and semiconductor element fabrication method according to the present invention can improve the reliability of a through-electrode formed in a through-hole of a semiconductor substrate and are useful as a semiconductor element, for example a semiconductor element having a through-electrode in a through-hole of a semiconductor substrate, and as a semiconductor element fabrication method.

What is claimed is:

1. A semiconductor element comprising:
   a semiconductor substrate;
   a circuit element disposed on the semiconductor substrate; and
   a through-hole formed in the semiconductor substrate and having a stripe-like concavo-convex structure on its sidewall; wherein
   stripes of the stripe-like concavo-convex structure are formed in a direction of a thickness of the semiconductor substrate, and
   the stripe-like concavo-convex structure has the stripes in a direction of penetration of the through-hole, so that certain cross-sections of the sidewall, which are taken along planes orthogonal to the direction of the thickness of the semiconductor substrate, have concavo-convex shapes.

2. The semiconductor element according to claim 1, wherein a conductive material electrically connected to an electrode of the circuit element is formed inside the through-hole.

3. The semiconductor element according to claim 1, wherein an aperture of the through-hole at an upper surface of the semiconductor substrate is greater in diameter than an aperture of the through-hole at a lower surface of the semiconductor substrate.

4. The semiconductor element according to claim 1, wherein the semiconductor substrate is made of a silicon system semiconductor or a compound semiconductor.

5. The semiconductor element according to claim 4, wherein the silicon system semiconductor is silicon or silica-germanium, and
   the compound semiconductor is gallium arsenide, gallium nitride or indium phosphorus.

6. The semiconductor element according to claim 1, wherein the through-hole is formed by using a dry etching method.

7. The semiconductor element according to claim 6, wherein the stripe-like concavo-convex structure is formed by using (1) indentations of an edge of an etching window of an etching mask used in the dry etching method or (2) impurities contained in a material of the semiconductor substrate.

8. The semiconductor element according to claim 6, wherein the dry etching method comprises the steps of:
   forming an etching mask on a material of the semiconductor substrate; and
   etching the material of the semiconductor substrate on which the etching mask is formed, by using an etching gas in which oxygen is mixed.

9. A semiconductor element fabrication method comprising the steps of:
   forming, while forming a through-hole in a material of a semiconductor substrate, a stripe-like concavo-convex structure, which has stripes in a direction of penetration of the through-hole, on a sidewall of the through-hole, the stripes of the stripe-like concavo-convex structure being formed in a direction of a thickness of the material of the semiconductor substrate, so that certain cross-sections of the sidewall, which are taken along planes orthogonal to the direction of the thickness of the semiconductor substrate, have concavo-convex shapes;
   forming a conductive material inside the through-hole; and
   electrically connecting the conductive material to an electrode of a circuit element.

10. The semiconductor element fabrication method according to claim 9, wherein the through-hole is formed by using a dry etching method.

11. The semiconductor element fabrication method according to claim 10, wherein the stripe-like concavo-convex structure is formed by using (1) indentations of an edge of an etching window of an etching mask used in the dry etching method or (2) impurities contained in the material of the semiconductor substrate.

12. The semiconductor element fabrication method according to claim 10, wherein the dry etching method comprises the steps of:

forming an etching mask on the material of the semiconductor substrate; and etching the material of the semiconductor substrate on which the etching mask is formed, by using an etching gas in which oxygen is mixed.

13. The semiconductor element fabrication method according to claim 10, wherein relationships between a size and/or a shape of the stripe-like concavo-convex structure, and (1) a degree of vacuum in a chamber used in the dry etching method, (2) a kind and/or an amount of a gas mixed in an etching gas in order to adjust a partial pressure of the etching gas in the chamber, (3) a level of a substrate bias applied to the material of the semiconductor substrate, (4) a size and/or a shape of an etching window of an etching mask used in the dry etching method, and (5) impurities contained in the material of the semiconductor substrate, are examined beforehand; and the degree of vacuum in the chamber, the kind and/or the amount of the gas to be mixed, the level of the substrate bias to be applied, and the size and/or the shape of the etching window, are set on a basis of results of an examination to form the through-hole.

14. The semiconductor element fabrication method according to claim 10, wherein a gas for depositing a reaction product on the sidewall of the through-hole is added to an etching gas.

* * * * *